United States Patent [19]

Byers

[11] Patent Number: 4,948,539
[45] Date of Patent: Aug. 14, 1990

[54] PHOTOTOOL WITH A GLASS MEMBER CONNECTED TO A FRAME MEMBER WITH AN ADHESIVE

[76] Inventor: Thomas L. Byers, 5840 Stewart Dr., Mustang, Okla. 73064

[21] Appl. No.: 250,325

[22] Filed: Sep. 27, 1988

[51] Int. Cl.⁵ .......................... B29C 39/10; B32B 7/12
[52] U.S. Cl. ...................................... 264/22; 156/285; 156/293; 156/382; 264/261; 264/511; 355/122; 428/45
[58] Field of Search ............ 156/382, 108, 293, 303.1, 156/107, 285; 428/14, 45, 46; 355/93, 122; 52/208, 308, 821; 55/55; 264/261, 101, 511, 22

[56] References Cited

U.S. PATENT DOCUMENTS

| 11,606 | 8/1854 | Gates . | |
|---|---|---|---|
| 20,918 | 7/1958 | Lane . | |
| 1,908,383 | 3/1933 | Vice . | |
| 2,310,443 | 2/1943 | Knudsen et al. | 52/308 |
| 2,346,170 | 4/1944 | Kalkusch | 52/308 |
| 2,444,505 | 7/1948 | Grogan | 355/122 |
| 3,239,981 | 3/1966 | Fitzgerald | 264/261 X |
| 3,502,531 | 3/1970 | Shockey | 156/293 |
| 3,634,009 | 1/1972 | Lindahn et al. | 355/128 |
| 3,635,280 | 1/1972 | Parsons | 156/293 X |
| 3,811,771 | 5/1974 | Hays | 355/122 X |
| 3,877,808 | 4/1975 | Jasperson, Jr. | 355/128 |
| 3,893,777 | 7/1975 | Jones | 264/261 X |
| 4,439,392 | 3/1984 | Schutzler | 264/261 X |
| 4,545,090 | 10/1985 | Redmond | 16/385 |
| 4,600,298 | 7/1986 | Emmert | 355/75 |
| 4,684,538 | 8/1987 | Klemarczyk | 427/54.1 |
| 4,698,115 | 10/1987 | Dodds | 156/382 X |
| 4,704,342 | 11/1987 | Lehrer et al. | 427/228 X |
| 4,717,605 | 1/1988 | Urban et al. | 156/273.5 X |
| 4,717,739 | 1/1988 | Chevreux et al. | 156/99 X |
| 4,806,191 | 2/1989 | Jechel et al. | 156/382 |

OTHER PUBLICATIONS

Exhibit A-Brochure, Tech-Con International Corp.
Exhibit B-Brochure, Images II, Precision Art Coordinators.
Exhibit C-Brochure, Precision Art Coordinators, Inc.
Exhibit D-Brochure, Applied Image.
Exhibit E-Brochure, Max Levy Autograph, Bulletin 1800.

Primary Examiner—Michael W. Ball
Assistant Examiner—Michele K. Yoder
Attorney, Agent, or Firm—Dunlap, Codding, Peterson & Lee

[57] ABSTRACT

A phototool having a first frame assembly hingedly connected to a second frame assembly by way of a hinge assembly wherein each frame assembly comprises a frame member with an insert opening through the frame member defining an edge and a glass member having an edge. The glass member is insertable into the insert opening with the edge on the glass member being spaced a distance from the edge on the frame member defining a connecting space therebetween and an adhesive is disposed in the connecting space for connecting the glass member to the frame member. The glass member is connected to the frame member by establishing a vacuum in the connecting space for pulling the adhesive in the connecting space. The adhesive in connecting space is cured for connecting the glass member to the frame member via the cured adhesive.

6 Claims, 7 Drawing Sheets

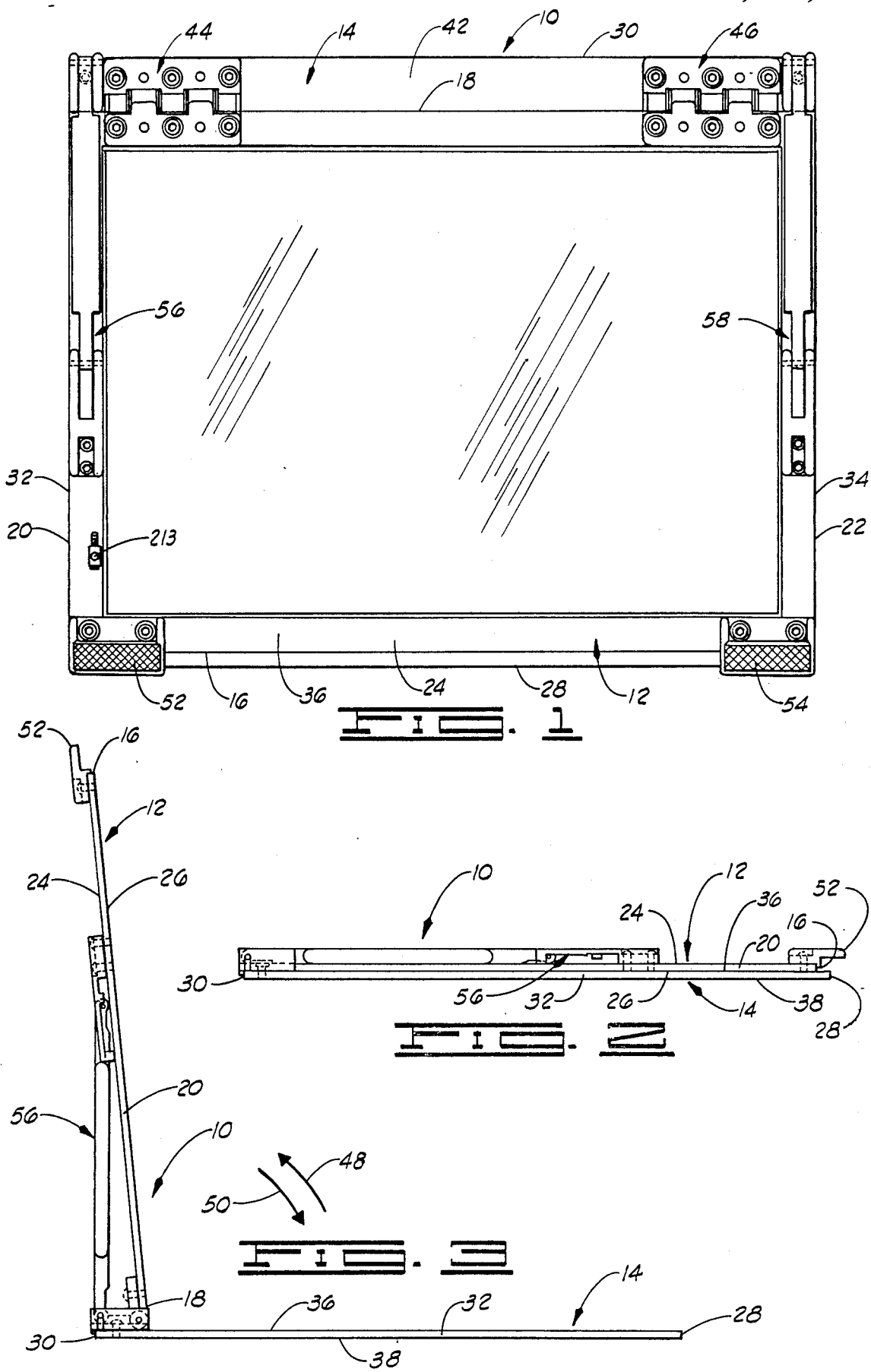

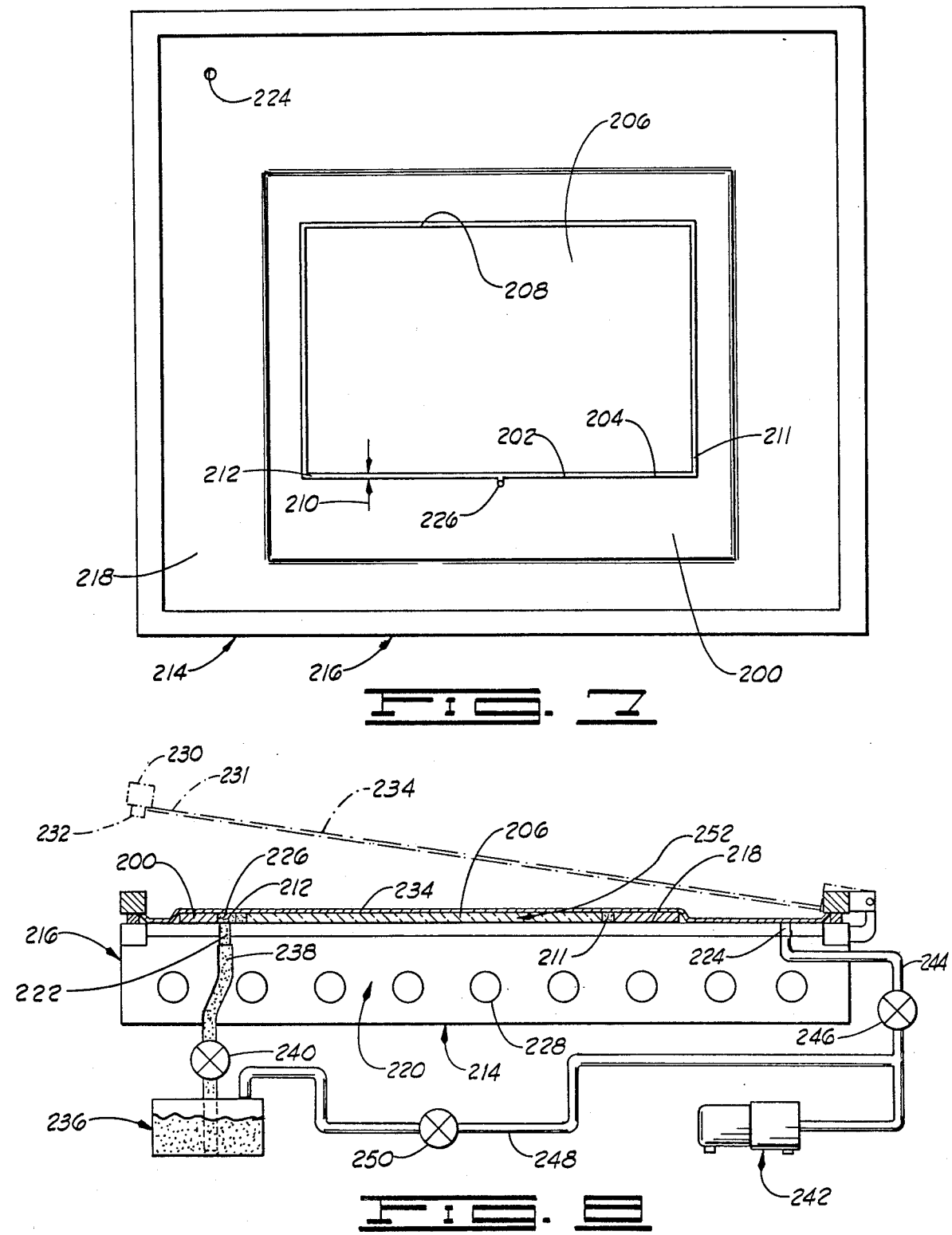

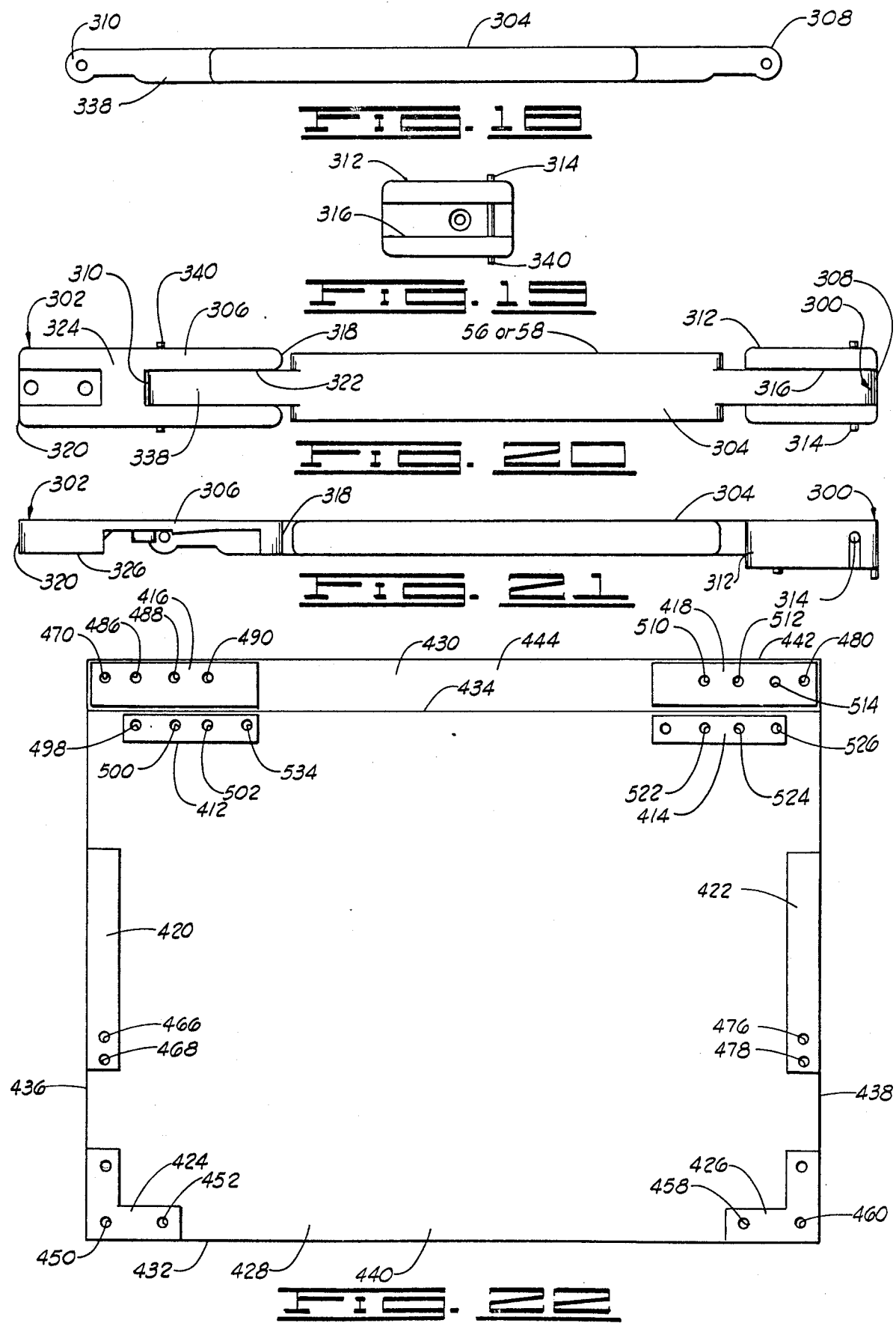

4,948,539

PHOTOTOOL WITH A GLASS MEMBER CONNECTED TO A FRAME MEMBER WITH AN ADHESIVE

CROSS REFERENCE TO RELATED APPLICATIONS

"PHOTOTOOL HAVING A STRUT FOR HOLDING HINGED MEMBERS IN AN OPENED POSITION, U.S. Ser. No. 250,303, filed Sep. 28, 1988, now U.S. Pat. No. 4,896,188; "PHOTOTOOL WITH HINGE ASSEMBLY AND METHOD FOR CONSTRUCTING HINGE ASSEMBLY", U.S. Ser. No. 250,602, filed Sept. 28, 1988; and "KIT FOR MAKING A PHOTOTOOL", U.S. Ser. No. 250,325, filed Sept. 28, 1988.

FIELD OF THE INVENTION

The present invention relates generally to phototools and, more particularly, but not by way of limitation, to a phototool having a frame assembly with a glass member connected to a frame member by way of an adhesive and an apparatus for connecting same.

BRIEF DESCRIPTION OF THE DRAWINGS

FIG. 1 is a top plan view of a phototool constructed in accordance with the present invention showing the frame assemblies in the closed position.

FIG. 2 is a side elevational view of the phototool of FIG. 1 showing the frame assemblies in the closed position.

FIG. 3 is a side elevational view of the phototool of FIGS. 1 and 2 showing the frame assemblies in the opened position.

FIG. 7 is a top plan view of an apparatus for connecting the glass member to the frame member for forming the frame assemblies used with the phototool shown in FIGS. 1, 2 and 3.

FIG. 8 is a sectional, diagrammatic view of the apparatus of FIG. 7.

FIG. 18 is a side view of the first arm of FIG. 17.

FIG. 19 is a top view of a clevis of a typical strut showing the hinge pin in place, but without the second arm connected thereto.

FIG. 20 is a top view of a typical strut assembled.

FIG. 21 is a side view of the strut of FIG. 20.

FIG. 22 is a top view of a glass member with plates connected thereto via adhesive for illustrating the components of a kit for constructing a phototool.

DESCRIPTION OF THE PREFERRED EMBODIMENTS

Figure 4:
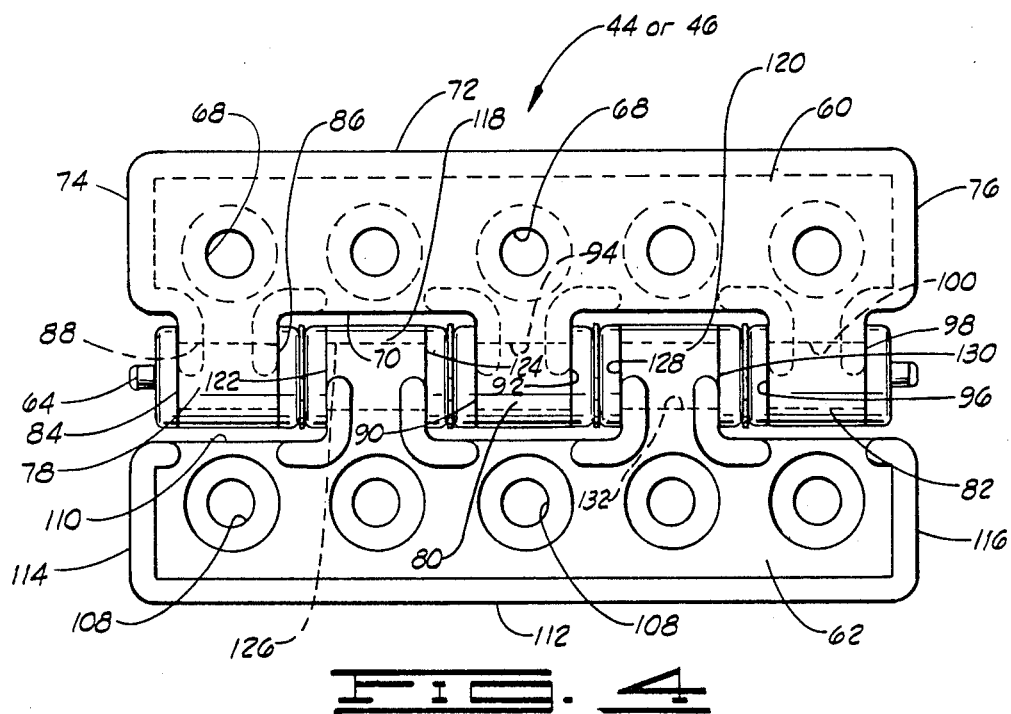
FIG. 4 is a top plan view of a hinge used with the phototool with FIGS. 1, 2 and 3 and constructed in accordance with the present invention.

Shown in FIGS. 1, 2 and 3 is a phototool constructed in accordance with the present invention and designated by the general reference numeral 10. The phototool 10 generally consists of a first frame assembly 12 (sometimes referred to as a first member) and a second frame assembly 14 (sometimes referred to as a second member).

The first frame assembly 12 is generally rectangularly shaped. The first frame assembly 12 has a first side 16, an opposite second side 18, a first end 20, an opposite second end 22, an upper surface 24 and a lower surface 26.

The second frame assembly 14 also is generally rectangularly shaped. The second frame assembly 14 includes a first side 28, an opposite second side 30, a first end 32, an opposite second end 34, an upper surface 36 and a lower surface 38.

The first frame assembly 12 is disposed generally on the upper surface 36 of the second frame assembly 14 with the lower surface 26 of the first frame assembly 12 being disposed generally adjacent the upper surface 36 of the second frame assembly 14 in a closed position (shown in FIGS. 1 and 2) of the first and the second frame assemblies 12 and 14. The second frame assembly 14 has a width generally between the first and the second sides 28 and 30 which is slightly larger than the width of the first frame assembly 12 generally between the first and the second sides 16 and 18 so that, in a closed position of the first and the second frame assemblies 12 and 14, the first side 28 of the second frame assembly 14 is disposed generally near and spaced a small distance from the first side 16 of the first frame assembly 12 and the second side 30 of the second frame assembly 14 is spaced a distance from the second side 18 of the first frame assembly 12, thereby leaving a connecting portion 42 on the second frame assembly 14. In the closed position of the first and the second frame assemblies 12 and 14, the first end 20 of the first frame assembly 12 is generally aligned with the first end 32 of the second frame assembly 14 and the second end 22 of the first frame assembly 12 is generally aligned with the second end 34 of the second frame assembly 14.

The second frame assembly 14 is hingedly connected to the first frame assembly 12 via a pair of hinge assemblies 44 and 46. One portion of each of the hinge assemblies 44 and 46 is secured to the connecting portion 42 of the second frame assembly 14 and another portion of each of the hinge assemblies 44 and 46 is secured to a portion of the upper surface 24 of the first frame assembly 12, generally near the second side 18 of the first frame assembly 12. The hinge assembly 44 is disposed generally near the first ends 20 and 32 of the first and the second frame assemblies 12 and 14 respectively and the hinge assembly 46 is disposed generally near the second ends 22 and 34. The hinge assemblies 44 and 46 connect the second frame assembly 14 to the first frame assembly 12 so that the first frame assembly 12 can be hingedly moved in a generally upwardly direction 48 (FIG. 3) to the opened position (FIG. 3) with respect to the second frame assembly 14 and so that the first frame assembly 12 may be moved in a generally downwardly direction 50 (FIG. 3) to the closed position (FIGS. 1 and 2) with respect to the second frame assembly 14.

Phototools, such as the phototool 10, commonly are used in producing printed circuit boards. In this type of process, a photomask is imprinted on a portion of the first frame assembly 12 or the second frame assembly 14 or, in some instance, a photomask may be imprinted on both the first and second frame assemblies 12 and 14 when it is desired to photographically impose a pattern on both sides of a substrate. Phototools, sometime referred to in the art as photomask assemblies, are well known in the art and a detailed description of the general use and operation of phototools is not deemed necessary.

A pair of grip bars 52 and 54 are connected to the upper surface 24 of the first frame assembly 12 generally adjacent the first side 16 of the first frame assembly 12 with the grip bar 52 being disposed generally near the first end 20 and the grip bar 54 being disposed generally near the second end 22 of the first frame assembly 12. The grip bars 52 and 54 are positioned and adapted so that an individual can grip one or both of the grip bars 52 and 54 for manually raising or lowering the first frame assembly 12 in the respective directions 48 and 50.

One end of a strut assembly 56 is pivotally connected to the upper surface 36 of the second frame assembly 14 generally near the first end 32. The opposite end of the strut assembly 56 is movably connected to the upper surface 24 of the first frame assembly 12, generally near the first end 20 of the first frame assembly 12.

One end of a strut assembly 58 is pivotally connected to the upper surface 36 of the second frame assembly 14 generally near the second end 34. The opposite end of a strut assembly 58 is movably connected to the upper surface 24 of the first frame assembly 12, generally near the second end 22 of the first frame assembly 12.

The strut assemblies 56 and 58 are identical in construction and operation. The strut assemblies 56 and 58 cooperate to support the first frame assembly 12 in the opened position with respect to the second frame assembly 14.

Figure 5:
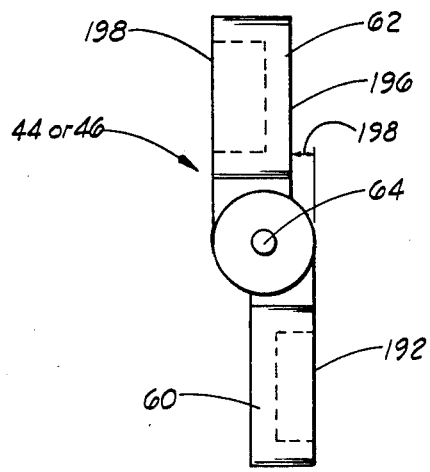
FIG. 5 is a side elevational view of the hinge of FIG. 4.
Figure 6:
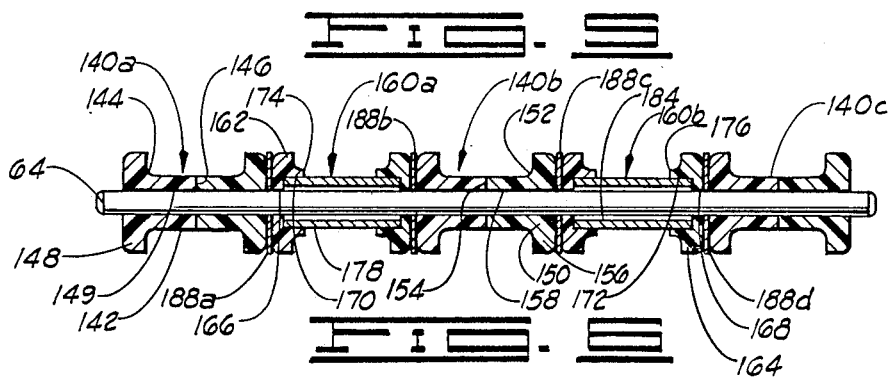
FIG. 6 is a cross-sectional view of the hinge of FIG. 4, but not showing the hinge plates.
Figure 9:
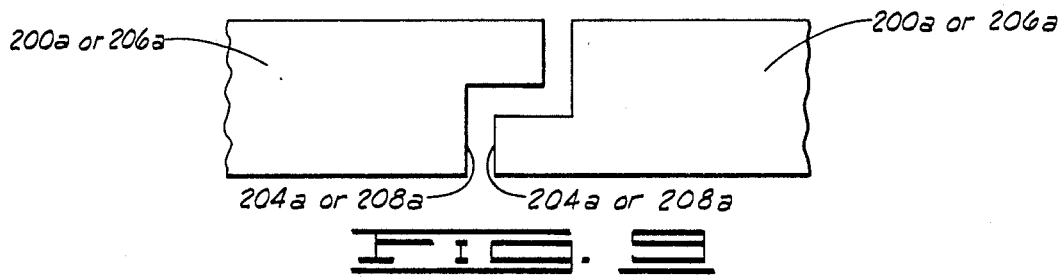
FIG. 9 is a side view showing a portion of a modified frame member and a modified glass member with modified edges.
Figure 10:
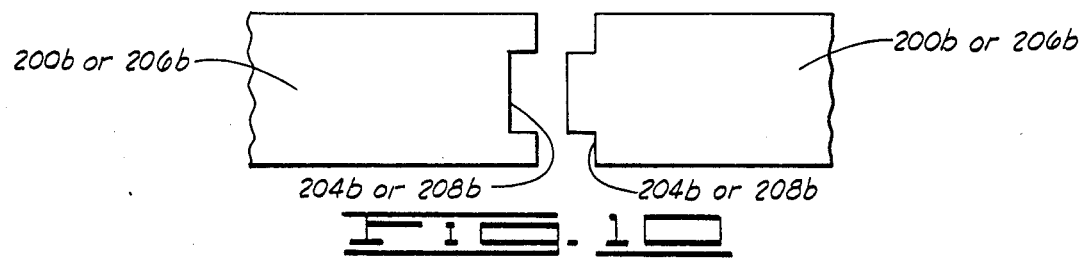
FIG. 10 is a side view of another modified frame member with modified edges.
Figure 11:
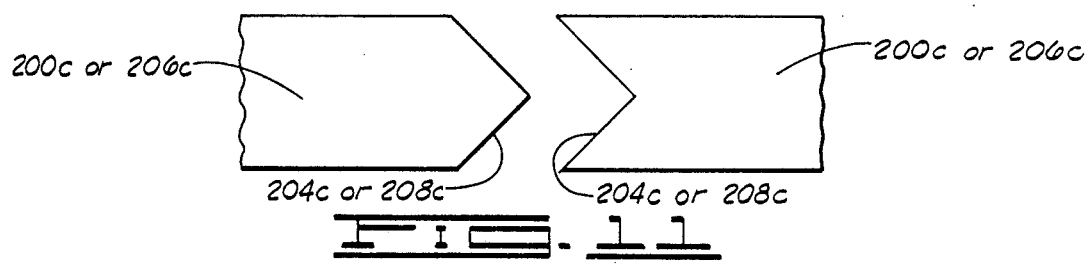
FIG. 11 is a side view showing yet another modified frame member and yet another modified glass member with modified edges.
Figure 12:
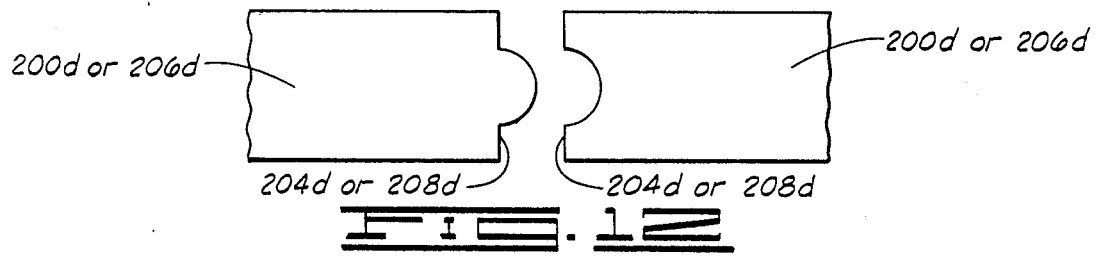
FIG. 12 is a side view showing still another modified frame member and still another modified glass member with modified edges.
Figure 13:
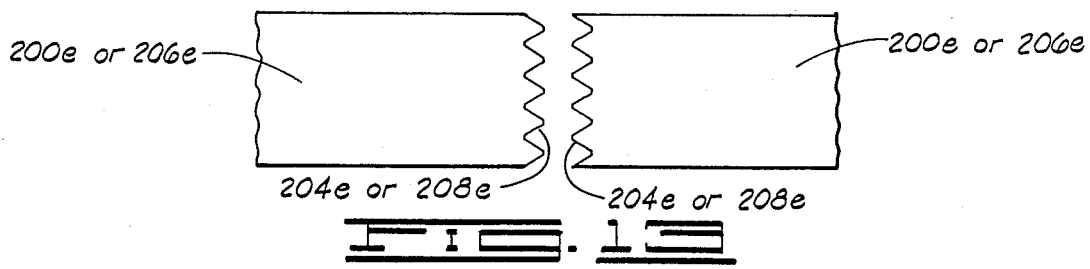
FIG. 13 is a side view showing one other modified frame member and one other modified glass member with modified edges.

The hinge assemblies 44 and 46 are identical in construction and a typical hinge assembly 44 or 46 is shown in greater detail in FIGS. 4, 5 and 6. The hinge assembly 44 or 46 includes a first hinge plate 60 which is pivotally connected to a second hinge plate 62 by way of a generally cylindrically shaped shaft 64.

As shown in FIG. 4, the first hinge plate 60 is generally rectangular shaped and includes a portion which is connectable to the upper surface 36 of the second frame assembly 14 by way of fasteners, such as screws or bolts which extend through openings 68 formed through the first hinge plate 60 (only some of the openings 68 being designated by a reference numeral in FIG. 4). The first hinge plate 60 has a first side 70, second side 72, first end 74 and a second end 76.

A first protrusion 78, a second protrusion 80 and a third protrusion 82 are formed on the first side 70 of the first hinge plate 60 and each of the protrusions 78, 80 and 82 extend a distance from the first side 70 of the first hinge plate 60.

The first protrusion 78 has a first side 84 and a opposite second side 86. An opening 88 (shown in dashed lines in FIG. 4) extends through the first protrusion 78 intersecting the first and the second sides 84 and 86.

The second protrusion 80 has a first side 90 and a opposite second side 92. An opening 94 (shown in dashed lines in FIG. 4) extends through the second protrusion 80 intersecting the first and the second sides 92 and 94.

The third protrusion 82 has a first side 96 and an opposite second side 98. An opening 100 (shown in dashed lines in FIG. 4) is formed through the third protrusion 82 intersecting the first and the second sides 96 and 98.

The first protrusion 78 is disposed generally near the first end 74 of the first hinge plate 60. The third protrusion 82 is disposed generally near the second end 76 of the first hinge plate 60. The second protrusion 82 is disposed generally between the first and the third protrusions 78 and 80. The first protrusion is spaced a distance from the second protrusion 80. The second protrusion 80 is spaced a distance from the third protrusion 82.

The second hinge plate 62 includes a portion which is adapted to be connected to the upper surface 24 of the first frame assembly 12 by way of fasteners, such as screws or bolts, which extend through openings 108 (only some of the openings 108 being designated by a reference numeral in FIG. 4) formed through a portion of the second hinge plate 62. The second hinge plate 62 is generally rectangularly shaped and has a first side 110, a second side 112, a first end 114 and a second end 116. A first protrusion 118 and a second protrusion 120 are formed on the second hinge plate 62 and the first and the second protrusions 118 and 120 each extends a distance from the first side 110 of the second hinge plate 62.

The protrusion 118 has a first side 122 and a second side 124. An opening 126 (shown in dashed lines in FIG. 4) is formed through the first protrusion 118 intersecting the first and the second sides 122 and 124.

The second protrusion 120 has a first side 128 and a second side 130. An opening 132 (shown in dashed lines in FIG. 4) is formed through the second protrusion 120 intersecting the first and the second sides 128 and 130.

The first protrusion 118 is sized so that, in an assembled position of the first and the second hinge plates 60 and 62, the first protrusion 118 on the second hinge plate 62 extends generally between the first and the second protrusions 78 and 80 on the first hinge plate 60. Further, the second protrusion 120 on the second hinge plate 62 is sized such that, in the assembled position of the first and the second hinge plates 60 and 62, the second protrusion 120 on the second hinge plate 62 extends generally between the second and the third protrusion 80 and 82 on the first hinge plate 60. In this assembled position, the openings 88, 94 and 100 in the protrusions 78, 80 and 82, respectively, are generally aligned with the openings 126 and 132 in the protrusions 118 and 120, respectively.

A non-rotating insert 140 is disposed in each of the openings 88, 94 and 100 of the protrusions 78, 80 and 82 respectively. The non-rotating inserts 140 are identical in construction and operation. The non-rotating inserts are individually identified in FIG. 6 by the reference numerals 140a, 140b and 140c.

Each of the non-rotating inserts 140 includes a cylindrically shaped first insert 142 having a first end 144 and a second end 146 (only one of the first ends 144 and only one of the second ends 146 being designated in FIG. 6 by a reference numeral). A cap 148 is formed on the first end 144 of each of the first inserts 142. An opening 149 extends through each first insert 142 intersecting the first and second ends 144 and 146.

Each non-rotating insert 140 also includes a second insert 150 which also is cylindrically shaped. Each second insert includes a first end 152 and a second 154. A cap 156 is formed on the first end 152 of each second insert 150. An opening 158 extends through each second insert 150 intersecting the ends 152 and 154.

The diameter of each of the openings 88, 94 and 100 is slightly smaller than the diameter of the outer peripheral surface of each of the first inserts 142 and each of the second inserts 150. In an assembled position, one of the first inserts is inserted through the opening 88 in the first protrusion 78 to a position wherein the cap 148 engages the first side 84 of the protrusion 78. In this assembled position of the first insert 142, the first insert 142 extends a distance through the opening 84 terminating with the second end 146 of the first insert 142.

The second insert 150 is inserted through the opening 88 in the first protrusion 78 to a position wherein the cap 156 engages the second side 86 of the first protrusion 78. In this assembled position of the second insert 150, the second insert 150 extends a distance through the opening 88 terminating with the second end 154 of the second insert 150. The first and the second inserts 142 and 150 are sized such that, in the assembled position, the second end 146 of the first insert 142 is disposed generally near the second end 154 of the second insert 150 and the openings 149 and 158 generally are aligned.

The non-rotating insert 140b is connected to the second protrusion 80 in a manner exactly like described before with respect to the connecting of the non-rotating insert 140a to the first protrusion 78. Further, the non-rotating insert 140c is connected to the third protrusion 82 in a manner exactly like that described before with respect to the non-rotating insert 140a.

The openings 88, 94 and 100 in the protrusions 78, 80 and 82 are sized so that the non-rotating inserts 140 have an interference fit with the protrusions 78, 80 and 82 for substantially preventing the rotation of the non-rotating inserts 140 in the openings 88, 94 and 100 during the operation of the hinge assemblies 44 and 46.

The hinge assemblies 44 and 46 also includes two rotating inserts 160a and 160b. The rotating insert 160a is connected to the first protrusion 118 on the second hinge plate 62 and the rotating insert 160b is connected to the second protrusion 126 on the second hinge plate 62. The rotating inserts 160a and 160b are identical in construction.

Each of the rotating inserts 160 includes a first cap 162 and a second cap 164. An opening 166 is formed through the first cap 162 and an opening 168 is formed through the second cap 164. A counterbore 170 is formed in a portion of one end of the first cap 162 and a similar counterbore 172 is formed in a portion of one end of the second cap 164. An annular rib 174 is formed on the first cap 162 generally adjacent the bore 170 and a similar rib 176 is formed on the second cap 164 generally adjacent the bore 172.

Each rotating insert 160 also includes a cylindrically shaped brace 178. The diameter of the outer peripheral surface of the brace 178 is sized to be slightly larger than the diameter of the bores 170 and 172 in the first and the second caps 162 and 164, respectively, so that the brace 178 can be press-fitted into the bores 170 and 172. An opening 184 is formed through each brace 178 intersecting the opposite ends thereof.

To assemble the rotating insert 160a to the first protrusion 118 on the second hinge plate 62, one end of the brace 178 first is press-fitted into the bore 170 in the first cap 162. The first cap 162 with the brace 178 connected thereto then is inserted through the opening 126 in the first protrusion 118 to a position wherein the first cap 162 engages the first side 122 of the first protrusion 118. The rib 174 on the first cap 162 is sized to be interference fit into the opening 126 in the first protrusion 118 to secure the first cap 162 with the brace 178 connected thereto in the opening 126 of the first protrusion 118. The second cap 164 then is connected to the second side 124 of the first protrusion 118 by inserting the rib 176 of the second cap 164 into the opening 126 of the first protrusion 118, the rib 176 being sized to be interference fit into the opening 126. As the second cap 164 is connected to the second side 124 of the first protrusion 118, the opposite end of the brace 178 is inserted into the bore 172 of the second cap 164 and press-fitted therein to connect the second cap 164 to the brace 178.

The other rotating insert 160b is connected to the second protrusion 120 in a manner exactly like that described before with respect to connecting the rotating insert 160a to the first protrusion 118.

After the non-rotating inserts 140 have been connected to the protrusions 78, 80 and 82 of the first hinge plate 60 and the rotating inserts 160 have been connected to the first and the second protrusions 118 and 120 of the second hinge plate 62, a hinge shaft 64 is inserted through the openings 149 and 158 in the non-rotating inserts 140 and through the openings 166 and 168 in the rotating inserts 160. The diameter of the openings 149, 158, 166 and 168 are slightly less than the diameter of the hinge shaft 64 so that the hinge shaft 64 is interference fitted within the openings 149, 158, 166 and 168. The diameter of each of the openings 184 in the braces 178 is larger than the diameter of the hinge shaft 64 so that the hinge shaft 64 is freely rotatable within the openings 184. The first and the second caps 162 and 164 each are sized and shaped so that the surface areas formed by the openings 166 and 168 are a minimum to reduce the amount or area of contacting surfaces between the first and the second caps 162 and 164 and the hinge shaft 64.

The non-rotating inserts 140 are constructed of a plastic material such as nylon. The rotating inserts 160 also are constructed of a plastic material such as nylon, except for the braces 178 which are constructed of a metal.

The portions of the inserts 140 and 160 which are in contact with the hinge shaft 64 are constructed of a plastic material and the inserts 140 and 160 are interference fitted on the hinge shaft 64. Since the portions of the inserts 140 and 160 are constructed of plastic and the hinge shaft 64 is constructed of metal, an interference fit can be provided between the inserts 140 and 160 and the hinge shaft 64 to substantially prevent movement of the inserts 140 and 160 in radial directions with respect to the hinge shaft 64, yet permitting the rotating inserts 160 to be rotatable on the hinge shaft 64 due to the minimum contact surface area between the rotating inserts 160 and the hinge shaft 64. The thrust washers 188a, 188b, 188c and 188d are interposed between the inserts 140 and 160 as shown in FIG. 6. A no-clearance fit between the inserts 140 and 160 and 188a, 188b, 188c and 188d once assembled with the shaft 64 prevents axial movement of the inserts 140 and 160 and the hinge plate 60 and 62 with respect to the hinge shaft 64.

In one form, the inserts 140 and 160 may be assembled on the hinge shaft 64 in the position shown in FIG. 6. This assembly can then be placed in a mold and the plastic first and second hinge plates 60 and 62 and the protrusions 78, 80, 82, 118 and 120 can be molded in a single operation about the assembly consisting of the inserts 140 and 160 and the hinge shaft 64.

When the hinge assemblies 44 and 46 are made in the manner just described by molding the hinge plates 60 and 62 and the protrusions 78, 80, 82, 118 and 120 about the assembly comprising the inserts 140 and 160 assembled on the hinge shaft 64, the assembly of the hinge assembly 44 and 46 is greatly simplified. Further, the openings 88, 94 and 100 in the protrusions 78, 80 and 82, respectively, in the openings 126 and 132 and the protrusions 118 and 120 automatically are sized to exactly the precise size for eliminating radial movement of the first hinge plate 60 relatively to the second hinge plate 62. In addition, this process automatically provides a no-clearance fit between the caps 162 and 164 of the rotating inserts 160a and 160b, the nonrotating inserts 140a, 140b and 140c, and the thrust washers 188a, 188b, 188c and 188d because the plastic injected into the mold which forms the hinge plates 60 and 62 and particularly forms the protrusions 78, 80, 82, 118 and 120 on the hinge plates 60 and 62, is under substantial pressure during the molding process and this pressure in the protrusions 78, 80, 82, 118 and 120 has the effect of pushing the rotating inserts 160 firmly against the nonrotating inserts 140 with the thrust washers 188 therebetween and maintaining a no-clearance fit as the plastic cools and becomes solid. This process or procedure for making the hinge assemblies 44 and 46 substantially improves the economy of manufacturer.

In operation, the second hinge plate 62 is pivotally movable in the upwardly and downwardly directions 48 and 50 with respect to the first hinge plate 60, since the portions of the first and the second caps 162 and 164 formed by the openings 166 and 168 have a minimum contact area with the hinge shaft 64 to reduce the frictional contact between the first and the second caps 162 and 164 and the hinge shaft 64 thereby permitting the relative movement between the first and the second hinge plates 60 and 62 while maintaining the interference fit. As shown in FIG. 5, the first hinge plate 60 also includes a lower surface 192. The second hinge plate 62 includes an upper surface 198 and a lower surface 198. First and the second protrusions 118 and 120 on the second hinge plate 62 are angled so that, when the hinge assemblies 44 and 46 are connected to the first and the second frame assemblies and the first and the second frame assemblies 12 and 14 are in the closed position, the lower surface 192 of the first hinge plate 60 is parallel with the lower surface 196 of the second hinge plate 62 and the lower surface 192 is spaced a distance 198 from the lower surface 196 of the second hinge plate 62. The distance 198 is about equal to the thickness of the first frame assembly 12 so that, in the closed position of the first and the second frame assemblies 12 and 14, the first frame assembly 12 lies flat on the second frame assembly 14 while maintaining the hinge connection therebetween provided by the hinge assemblies 44 and 46.

Due to the no-clearance fit between the inserts 140 and 160 and the washers 188 and the interference fit between the openings in the inserts 142 and 150 and the hinge shaft 64, the first frame assembly 12 is not movable in axial or radial direction with respect to the second frame assembly 14. Thus, the first frame assembly 12 remains positioned with respect to the second frame assembly 14 even though the frame assemblies 12 and 14 are hinged together for movement to opened and closed positions.

Shims can be disposed under the first hinge plates 60 to accommodate first frame assemblies 12 having different thicknesses.

Shown in FIG. 7 is a typical frame assembly 12 or 14 particularly adapted to be used in connection with the phototool 10. The frame assembly 12 or 14 comprises a frame member 200 which is constructed of a metal. The frame member 200 is generally rectangularly shaped and includes a rectangularly shaped insert opening 202 forming a rectangularly shaped edge 204 extending about a portion of the frame member 200.

The frame assembly 12 or 14 also includes a glass member 206 which generally is rectangularly shaped thereby forming an edge 208 extending generally about the outer peripheral surface of the glass member 206. The glass member 206 is sized and shaped to be disposed generally within the insert opening 202 so that the edge 204 of the frame member 200 is disposed near and spaced a distance 210 from the edge 208 of the glass member 206. The space between the frame member 200 and the glass member 206 is referred to herein as the connecting space 211.

As shown in FIG. 1, the hinge assemblies 44 and 45, the struts 56 and 58, the grip bars 52 and 54 and a vacuum fitting 213 are connected to the frame members 200 of the first and second frame members 200 thereby eliminating any necessity of drilling holes in the glass members 206. The frame members 200 make it easier to attach these various components as opposed to attaching such components to glass, and this construction permits full use of the glass members 206.

In operation, the glass member 206 is inserted into the insert opening 202 and visually positioned within the insert opening 202 so that the connecting space 211 extends between the edge 208 of the glass member 206 and the edge 204 of the frame member 200 generally about the outer peripheral surface of the glass member 206. The edge 208 of the glass member 206 is connected to the edge 204 of the frame member 200 by way of an adhesive 212 disposed in the connecting space 211 to connect the glass member 206 to the frame member 200 by way of the adhesive 212.

The present invention also contemplates an apparatus for connecting the edge 208 of the glass member 206 to the edge 204 of the frame member 200 by way of the adhesive 212. Shown in FIGS. 7 and 8, is an apparatus 214 adapted for connecting the edge 208 of the glass member 206 to the edge 204 of the frame member 200 by way of the adhesive 212.

The thickness of the frame member 200 has a thickness which substantially is the same as the thickness of the glass member 206. The edge 208 of the glass member 206 is connected to the edge 204 of the frame member 200 in such a manner that no portions or other devices are required which overlap the frame member 200 and the glass member 206. In an assembled position, the upper surface of the glass member 206 is substantially coplanar with the upper surface of the frame member 200, and the lower surface of the glass member 206 is substantially coplanar with the lower surface of the frame member 200.

The apparatus 214 includes a base assembly 216 having an upper support surface 218 constructed of a glass material. The base assembly 216 is generally rectangularly shaped and encloses and encompasses a component space 220.

The upper support surface 218 is adapted to support the frame member 200 and the glass member 206 in the manner shown in FIG. 8. A fill-tube opening 222 is formed through the upper support surface 218 and a vacuum port 224 also is formed through a portion of the upper support surface 218. A notch 226 is formed in a portion of the edge 204 of the frame member 200.

The fill-tube opening 222 is positioned on the upper support surface 218 so that, when the frame member 200 and the glass member 206 are positioned on the upper support surface 218, the notch 226 and the adjacent portion of the connecting space 211 are positionable generally over the fill-tube opening 222, for reasons to be made more apparent below. The vacuum port 224 is positioned on the upper support surface 218 so that, when the frame member 200 and glass member 206 are positioned on the upper support surface 218, the vacuum port 224 is spaced a distance from the frame member 200 as shown in FIG. 7.

As shown in FIG. 8, a plurality of ultraviolet lights 228 (only some of the ultraviolet lights being designated by the reference numeral 228 in FIG. 8) are disposed and supported within the components space 220 in the base assembly 216. The ultraviolet lights 228 are connected to an electrical energy source (not shown) by way of a switch (not shown). The ultraviolet lights 228 are positioned within the component space 220 so that, when the switch is closed, electrical energy is supplied to the ultraviolet lights 228, ultraviolet light is emitted therefrom through the glass upper support surface 218, for reasons to be made more apparent below.

One end of a lid 234 is pivotally connected to one side of the base assembly 216, as shown in FIG. 8. The lid 234 is sized and shaped to substantially encompass the upper surface of the base assembly 216 in a closed position (shown in solid lines in FIG. 8) of the lid 234. The lid 234 is constructed of a rigid frame 230, a flexible material 231, and a closed cell sponge rubber perimeter seal 232 for containing a vacuum between the flexible material 231 and the upper surface 218 of the apparatus 214. The lid 234 also is movable to an opened position (partially shown in dashed lines in FIG. 8).

The apparatus 214 also includes an adhesive source 236 having a supply of the adhesive 212 disposed therein. The adhesive source 236 is connected to the fill-tube opening 222 by way of a conduit 238 and a valve 240 is interposed in the conduit 238 generally between the adhesive source 236 and the fill-tube opening 222. In the opened position of the valve 240, communication is established between the adhesive 212 in the adhesive source 236 and the fill-tube opening 222 and, in the closed position of the valve 240, communication is interrupted between the adhesive 212 in the adhesive source 236 and the fill-tube opening 222.

The apparatus 214 also includes a vacuum source 242. The vacuum source 242 is connected to the vacuum port 224 by way of a conduit 244 and a valve 246 is interposed in the conduit 244. In the open position of the valve 246, communication is established between the vacuum source 242 and the vacuum port 224 and, in the closed position of the valve 246, communication is interrupted between the vacuum source 242 and the vacuum port 224.

The vacuum source 242 also is connected to the adhesive source 236 by way of a conduit 248. A valve 250 is interposed in the conduit 248. In the open position in the valve 250, communication is established between the vacuum source 242 and the adhesive source 236 and, in the closed position of the valve 250, communication is interrupted between the adhesive source 236 and the vacuum source 242.

In operation, the frame member 200 is initially positioned on the upper support surface 218 so that the notch 226 is disposed generally above the fill-tube opening 222. The glass member 206 is inserted into the insert opening 202 and positioned so that the connecting space 211 generally is formed between the edge 208 of the glass member 206 and the edge 204 of the frame member 200 with the notch 226 and the adjacent portion of the connecting space 211 being positioned generally above the fill-tube opening 222. The lid 234 then is moved to the closed position wherein the lid 234 cooperates with the upper support surface 218 to substantially enclose the frame member 200 and the glass member 206 generally within a frame space 252 (shown in FIG. 8). The frame space 252 substantially is airtight.

The valve 250 then is opened to establish communication between the vacuum source and the adhesive source 236. The valve 250 is retained in the opened position for a period of time sufficient to substantially remove air bubbles from the adhesive 212 in the adhesive source 236. Then, the valve 250 is moved to the closed position thereby interrupting communication between the vacuum source 242 and the adhesive source 236.

The valve 246 then is opened to establish communication between the vacuum source and the connecting space 211 thereby establishing a vacuum generally within the connecting space 211. The valve 240 then is opened to establish communication between the adhesive 212 in the adhesive source 236 and the connecting space 211. When the valve 240 is opened, the vacuum in the connecting space 211 causes the adhesive 212 in the adhesive source 236 to be pulled or sucked through the conduit 238 and through the notch 226 and into the connecting space 211. The adhesive 212 continues to flow from the adhesive source 236 until the adhesive substantially fills the connecting space 211. The valve 240 then is moved to the closed position.

In the embodiment illustrated, the adhesive 212 is flowable in a non-cured state and the adhesive 212 is curable upon exposure to ultraviolet light. An adhesive of this type is commercially available from Norland Products, Inc., New Brunswick, N.J. and designated Norland Optical Adhesive No. 61.

After the adhesive 212 has filled the connecting space 211, the switch is closed thereby causing the ultraviolet lights 288 to emit ultraviolet light. The ultraviolet light is emitted through the glass upper support surface 218 and the adhesive 212 in the connecting space 211 is thereby exposed to ultraviolet light. The adhesive 212 in the connecting space 211 is exposed to the ultraviolet light for a period of time sufficient to cure the adhesive 212. The cured adhesive 212 in the connecting space 211 adhesively connects the edge 204 of the frame member 200 to the edge 208 of the glass member 206.

The vacuum established in the frame space 252 also cooperates to pull the frame member 200 and the glass member 206 down toward the upper surface 218 so the lower surface of the frame member 200 substantially is flush or coplanar with the lower surface of the glass member 206.

Shown in FIGS. 9, 10, 11, 12 and 13 are modified frame members 200a, 200b, 200c, 200d and 200e having respective modified edges 204a, 204b, 204c, 204d and 204e. The edges of the modified frame members are shaped to about mate with modified edges 208a, 208b, 208c, 208d and 208e of modified glass members 206a, 206i b, 206c, 206d and 206e. Any of these modified edges shown in FIGS. 9-13 can be substituted for the straight edge shown in FIGS. 7 and 8. The edges shown in FIGS. 9-13 have the advantage of improving the strength of the joint between the frame member and the glass member. In each instance, the edge of one of the frame member or glass member has an irregular configuration and the edge of the other frame member or glass member has a mating irregular configuration. The frame members shown in FIGS. 9-13 are connected to the respective glass members shown in FIGS. 9-13 in a manner exactly like that described before in connection with the frame member 200 and the glass member 206 shown in FIGS. 7 and 8.

As mentioned before, the phototool 10 includes strut assemblies 56 and 58. Each of the strut assemblies 56 and 58 is adapted to support the first frame assembly 12 in an opened position extending at an angle to the second frame assembly 14. As shown in FIG. 3, the strut assemblies 56 and 58 particularly are adapted to support the first frame assembly 12 extending at an angle of about ninety degrees to the second frame assembly 14.

The strut assemblies 56 and 58 each include a portion which is movable for varying the length of the strut assemblies 56 and 58 generally between the opposite ends of the strut assemblies 56 and 58 as the first frame assembly 12 is moved to the opened position and to the closed position. In general, the length of each strut assemblies 56 and 58 is increased as the first frame assembly 12 is moved from the opened position to the closed position. By the same token, the length of each strut assembly 56 and 58 is decreased as the first frame assembly 12 is moved from the closed position to the opened position.

A typical strut assembly 56 or 58 is shown enlarged in FIGS. 20 and 21. The various components of the strut assembly 56 or 58 are shown in greater detail in FIGS. 14, 15, 16, 17, 18 and 19.

Each strut assembly 56 or 58 has a first end 300 and a second end 302. The first end 300 is pivotally connected to the upper surface 36 of the second frame assembly 14. The second end 302 is connected to the upper surface 24 of the first frame assembly 12.

Figure 14:
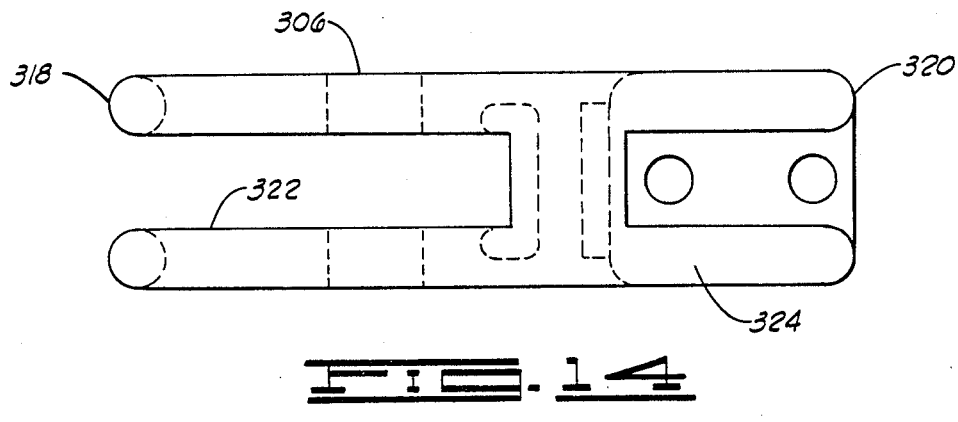
FIG. 14 is a top plan view of a second arm of a typical strut.
Figure 15:
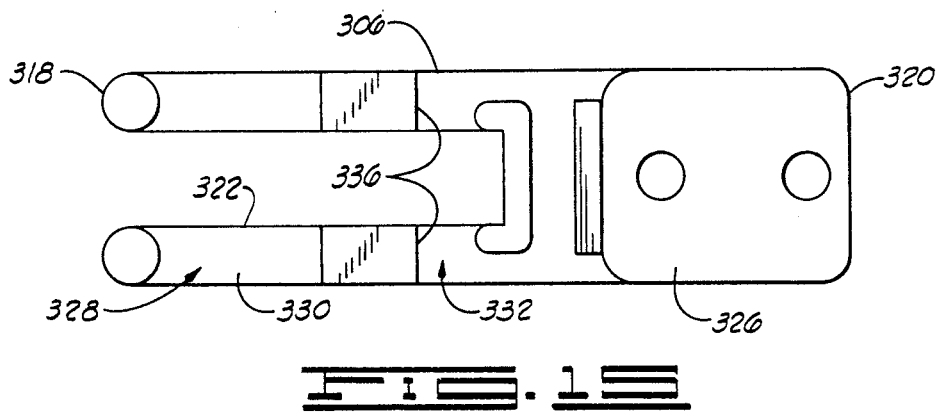
FIG. 15 is a bottom view of the second arm of FIG. 14.
Figure 16:
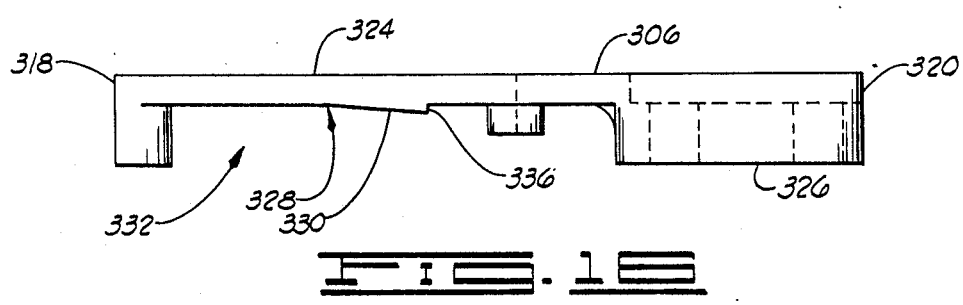
FIG. 16 is a side view of the second arm of FIGS. 14 and 15.

Each strut assembly 56 or 58 includes a strut arm 304 sometimes referred to herein as the first arm (shown in greater detail in FIGS. 17 and 18) and a strut bracket 306, sometimes referred to herein as the second arm (shown in greater detail in FIGS. 14, 15 and 16).

Figure 17:
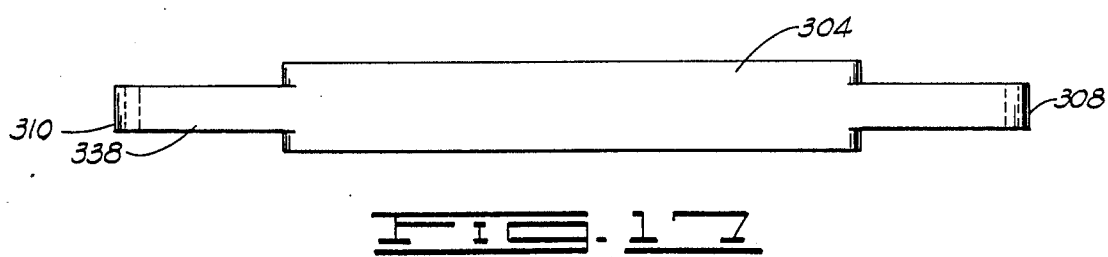
FIG. 17 is a top plan view of a first arm of a typical strut.

The strut arm 304 has a first end 308 and a second end 310 (FIGS. 17 and 18). The first end 308 is pivotally connected to the upper surface 36 of the second frame assembly 14. More particularly, the strut arm 304 includes a clevis 312 (shown more clearly in FIGS. 19, 20 and 21) and the clevis 312 is connected to the upper surface 36 of the second frame assembly 14. The first end 308 of the strut arm 304 is pivotally connected to the clevis 312 via a pin 314 (FIG. 19) which extends through the clevis 312 and through a portion of the strut arm 304 generally near the first end 308 thereof. The clevis includes a recess 316 (FIG. 20) and a portion of the first arm 304 near the first end 308 is sized to be slidingly disposed in the recess 316.

The strut bracket 306 has a first end 318 and a second end 320. The second end 320 of the strut bracket 306 is connected to the upper surface 24 of the first frame assembly 12 and forms the second end 302 of the strut assembly 56 or 58. The second end 310 of the strut arm 304 is movably connected to the first end 318 of the strut bracket 306 for varying the length of the strut assembly 56 or 58, in a manner to be made more apparent below.

A slot 322 (FIG. 14, 15 and 20) intersects the first end 318 of the strut bracket 306 and the slot 322 extends a distance into the strut bracket 306 generally toward the second end 320 thereof. The slot 322 also intersects an upper surface 324 and a lower surface 326 of the strut bracket 306.

As shown more clearly in FIGS. 15 and 16, a recess 328 is formed in the lower surface 326 of the strut bracket 306 and the recess 328 extends a distance generally toward the upper surface 324 terminating with a slide surface 330. The slide surface 330 is spaced a distance from the lower surface 326 of the strut bracket 306. The slot 322 intersects the recess 328, and the slot 322 and the recess 328 cooperate to form a space 332 generally under the upper surface 324 of the strut bracket 306.

As shown in FIG. 16, a stop surface 336 is formed in the slide surface 330. The stop surface 336 is disposed in the space 332 and the stop surface 336 is disposed on opposite sides of the slot 322.

The strut arm 304 includes a reduced width narrow portion 338 which is sized and shaped to slidingly fit in the slot 322 in the strut bracket 306. A pin 340 (FIG. 20) is disposed through the strut arm 304 and the pin 340 extends a distance from the opposite sides of the narrow portion 338 of the strut arm 304. The pin 340 engages the slide surface 330 during the operation of the strut assembly 56 or 58. The pin 340 is engageable with the stop surface 336 for releaseably holding the first arm 304 in one position with respect to the strut bracket 306.

In the closed position of the first frame assembly 12 on the second frame assembly 14, the narrow portion 338 of the strut arm 304 is positioned generally near the first end 318 of the strut bracket 306 and the strut assembly 56 or 58 has its maximum length. In this position, the pin 340 is disposed on the slide surface 330 and positioned generally near the first end 318 of the strut bracket 306. The pin 340 cooperates to maintain the strut arm 304 connected to the strut bracket 306.

As the first frame assembly 12 is moved in the direction 48 toward the opened position, the narrow portions 338 of the strut arm 304 slides in the slot 332 in a direction generally toward the second end 320 of the strut bracket 306, thereby decreasing the overall length of the strut assembly 56 or 58. The narrow portion 338 continues to move in this direction in the slot 322 as the first frame assembly 12 is moved in the direction 48 until the pin 340 passes the stop surface as the first frame assembly 12 is moved into the opened position.

If the first frame assembly 12 tends by gravity to move in the downward direction 50 generally toward the closed position, the pin 340 engages the stop surface 336 to releaseably prevent such movement. The pin 340 and the stop surface 336 thus cooperate to hold the first frame assembly 12 in the opened position until intentionally moved to the closed position.

The pin 340 is cylindrically shaped and the stop surface 340 is relatively small and extends only a small distance into the space 332. The pin 340 and the stop surface 336 are sized and shaped to releaseably hold the first frame member 12 in the opened position.

When it is desired to close the first frame assembly 12, an individual grips one or both of the grip bars 52 and 54 and pulls the first frame assembly 12 in the downward direction 50. As the first frame assembly 12 is pulled in the downward direction 50, the pin 340 rides over the stop surface 336 and is disengaged therefrom. As the first frame assembly 12 is moved in the downward direction 50, the narrow portion 338 of the strut arm 304 slidingly moves in the slot 322 in a direction generally toward the first end 318 of the strut bracket 306 until the first frame assembly 12 has been moved to the closed position.

In some instances, a user has an existing glass member and the user desires to utilize this existing glass member. In the past, such a customer would have to have the glass specially mounted for use as a phototool. The present invention contemplates a kit of components which would enable a user to adapt the user's existing glass member for use in a phototool.

The present invention contemplates a kit for assembling a first member to a second member for forming a phototool so user will be able to utilize their own glass members and quickly and easily form such glass members into a phototool.

Figure 23:
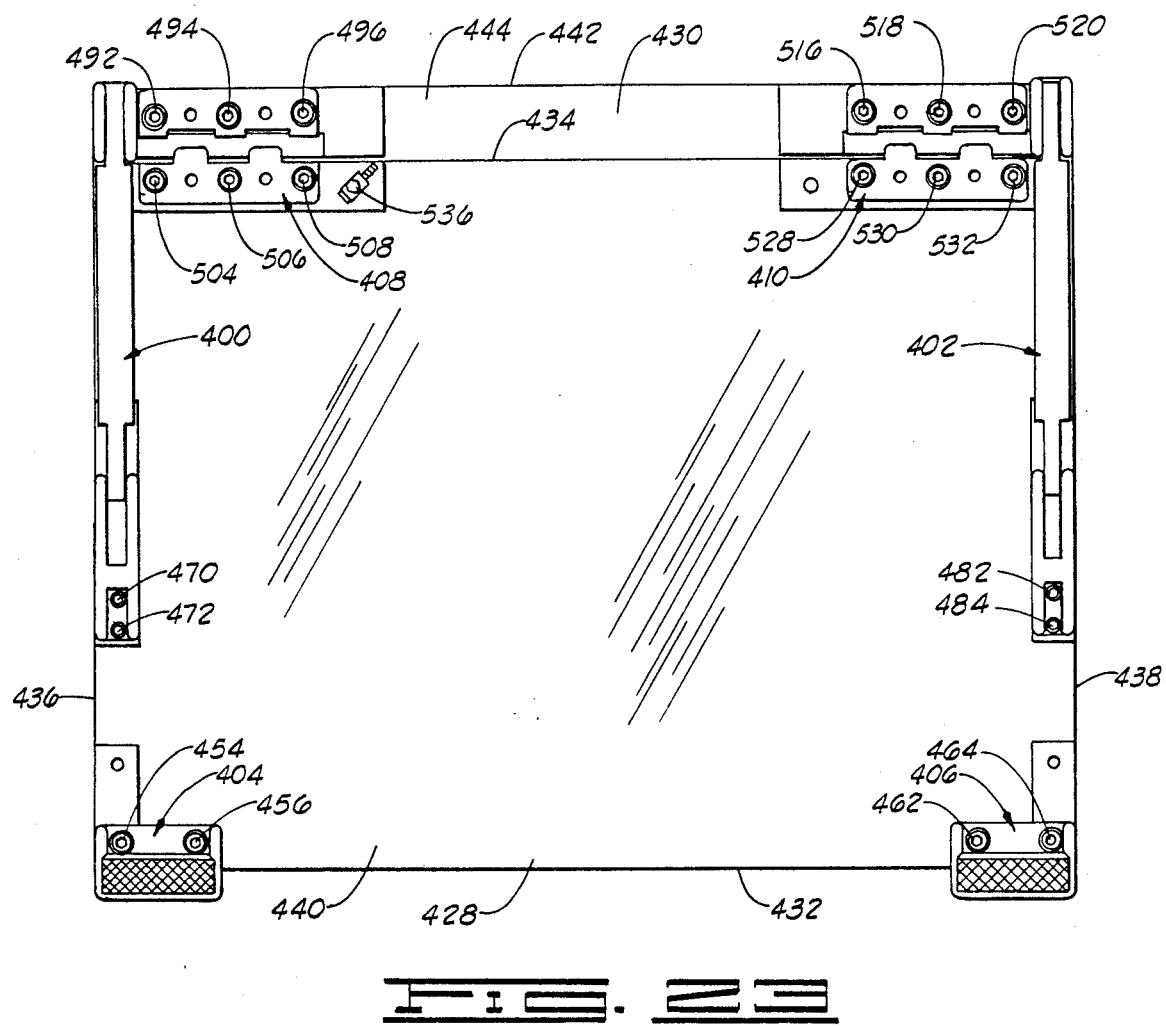
FIG. 23 is a top view of the glass member of FIG. 22 showing the various components of the assembled phototool connected thereto.

The kit contemplated by the present is illustrated in FIGS. 22 and 23. The kit comprises a pair of strut assemblies 400 and 402 which are constructed exactly like the strut assemblies 56 and 58 described in detail before, a pair of grip bars 404 and 406 which are constructed exactly like the grip bars 52 and 54 described in detail before, a pair of hinge assemblies 408 and 410 which are constructed exactly like the hinge assemblies 44 and 46 described in detail before, two front hinge plates 412 and 414, two rear hinge plates 416 and 418, a pair of strut bracket mounting plates 420 and 422, and a pair of grip bar mounting plates 424 and 426.

Shown in FIGS. 22 and 23 is a first member 428 which is constructed of glass. Also, shown in FIGS. 22 and 23 is a second member 430 which also may be constructed of glass. Only a portion of the second member 430 is shown in FIGS. 22 and 23.

The first member 428 has a first side 432, a second side 434, a first end 436, a second end 438, an upper surface 440 and a lower surface (not shown). The second member 430 has a first side which is aligned with the first side 432, a second side 442 which extends beyond the second side 434 of the first member 428, a first end which is aligned with the first end 436, a second end which is aligned with the second end 438, an upper surface 444 and a lower surface (not shown).

One rear hinge mounting plate 416 is connected by an adhesive to the upper surface 444 of the second member 430 generally near the second side 442 and generally near the first end. The other rear hinge mounting plate 418 is connected by an adhesive to the upper surface 444 of the second member 430 generally near the second side 442 and generally near the second end.

One front hinge mounting plate 412 is connected by an adhesive to the upper surface 440 of the first member 428 generally near the second side 434 and generally near the first end 436. The other front hinge mounting plate 414 is connected by an adhesive to the upper surface 440 of the first member generally near the second side 434 and generally near the second end 438.

One of the grip bar mounting plates 424 is connected by an adhesive to the upper surface 440 of the first member 428 generally near the first side 432 and generally near the first end 436. The other grip bar mounting plate 426 is connected by an adhesive to the upper surface 440 of the first member 428 generally near the first side 432 and generally near the second end 438.

One of the strut bracket mounting plates 420 is connected by an adhesive to the upper surface 440 of the first member 428 and extends a distance generally along the first end 436. The other strut bracket mounting plate 422 is connected by an adhesive to the upper surface 440 of the first member 428 and extends a distance generally along near the second end 438.

The grip bar mounting plate 424 includes a pair of tapped holes 450 and 452. The grip bar 404 is connected to the grip bar mounting plate 424 by two fasteners 454 and 456 which extend through the grip bar 404 and into the tapped holes 450 and 452.

The grip bar mounting plate 426 includes a pair of tapped holes 458 and 460. The grip bar 406 is connected to the grip bar mounting plate 426 by two fasteners 462 and 464 which extend through the grip bar 406 and into the tapped holes 458 and 460.

The strut bracket mounting plate 420 includes a pair of tapped holes 466 and 468. The rear hinge plate 416 includes a tapped hole 470. The clevis of the strut assembly 400 is connected to the strut bracket mounting plate 420 by a pair of fasteners 471 and 472 which extend through the strut arm and into the tapped holes 466 and 468. The clevis of the strut assembly 400 is connected to the rear hinge plate 416 by a fastener (not shown) which extends into the hole 470.

The strut bracket mounting plate 422 includes a pair of tapped holes 476 and 478. The rear hinge mounting plate 418 includes a tapped hole 480. The strut arm of the strut assembly 402 is connected to the strut bracket mounting plate 422 by a pair of fasteners 482 and 484 which extend through the strut arm and into the tapped holes 476 and 478. The clevis of the strut assembly 402 is connected to the rear hinge plate 418 by a fastener (not shown) which extends into the hole 480.

The rear hinge plate 416 has three additional tapped holes 486, 488 and 490. The first hinge plate of the hinge assembly 408 is connected to the rear hinge plate 416 via three fasteners 492, 494 and 496 which extend through the first hinge plate of the hinge assembly 408 and into the tapped holes 486, 488 and 490.

The front hinge plate 412 includes three tapped holes 498, 500 and 502. The second hinge plate of the hinge assembly 408 is connected to the first hinge plate 412 via three fasteners 504, 506 and 508 which extends through the second hinge plate of the hinge assembly 408 and into the tapped holes 498, 500 and 502.

The rear hinge plate 418 has three additional tapped holes 510, 512 and 514. The first hinge plate of the hinge assembly 410 is connected to the rear hinge plate 418 via fasteners 516, 518 and 520 which extend through the first hinge plate of the hinge assembly 410 and into the tapped holes 510, 512 and 514.

The front hinge plate 414 includes three tapped holes 522, 524 and 526. The second hinge plate of the hinge assembly 410 is connected to the front hinge plate 414 via three fasteners 528, 530 and 532 which extend through the second hinge plate of the hinge assembly 410 and into the tapped holes 522, 524 and 526.

The front hinge plate 412 includes an additional tapped hole 534. A vacuum fitting 536 is threaded into the tapped hole 534.

The components in the kit thus are connectable to the first and second members 428 and 430 to form a phototool which functions like the phototool 10 described in detail before.

The strut assemblies 400 and 402 can be connected to the first member 428 by an adhesive, thereby eliminating the mounting plates 420 and 422. Further, the grip bars 404 and 406 can be adhesively connected to the first member 428 thereby eliminating the mounting plates 424 and 426. It is preferred to connect the hinge assemblies 408 and 410 and the clevis portions of the strut assemblies 400 and 402 to the second member 430 via the rear hinge mounting plates 416 and 418 so these components may be disconnected and reconnected so that shims may be installed there between to enable the phototool to be adjusted for accommodating circuit board substates of various thicknesses in a flush overlying relationship between the first member 428 and the second member 420.

The various mounting plates are relatively thin. In some instances, it may be desirable to place inserts with tapped holes in the tapped holes in the various mounting plate. The fasteners then would be threaded into the inserts.

Changes may be made in the construction and the operation of the various components and the assemblies described herein and changes may be made in the steps or sequence of steps of the methods described herein without departing from the spirit and the scope of the invention as defined in the following claims.

I claim:

1. A method for making a phototool frame assembly wherein the frame assembly comprises a glass member having an edge and a frame member with an insert opening formed through the frame member defining an edge on the frame member with a curable adhesive from an adhesive source, the curable adhesive when cured connecting the glass member to the frame member for forming the frame assembly, the method comprising the steps of:
    positioning the glass member in the insert opening of the frame member with the edge of the frame member being spaced a distance from the edge of the glass member, the space between the edge of the glass member and the edge of the frame member comprising a connecting space, the frame member surrounding the glass member when the glass member is inserted into the insert opening, wherein the glass member has an upper surface and a lower surface and a thickness extending generally between the upper and the lower surface, and wherein the frame member has an upper surface and a lower surface and a thickness extending generally between the upper and lower surfaces, and wherein the thickness of the glass member is substantially the same as the thickness of the frame member, and wherein no portions of the glass member overlap the frame member, and wherein no portions of the frame member overlap the glass member comprising:
    positioning on the base assembly the glass member with respect to the frame member so that the lower surface of the glass member is substantially coplanar with the lower surface of the frame member; and
    positioning on the base assembly the glass member and the frame member so that the upper surface of the glass member is substantially coplanar with the upper surface of the frame member;
    filling the connecting space with an adhesive, comprising:
        closing a flexible lid over the base assembly with the glass member and the frame member being disposed between the flexible lid and the base assembly for enclosing substantially the glass member and the second member in a frame space with the connecting space also being enclosed within the frame space, the frame space being disposed generally between the flexible lid and the base assembly;
        establishing a vacuum in the connecting space; and
        establishing communication between the adhesive in the adhesive source and the connecting space for flowing the adhesive from the adhesive source into the connecting space so the adhesive substantially fills the connecting space; and
        curing the adhesive in the connecting space for connecting the glass member to the frame member via the cured adhesive.

2. The method of claim 1 for use with a vacuum source defined further to include the steps of:
    establishing communication between the adhesive in the adhesive source and the vacuum source prior to establishing communication between the adhesive and the connecting space for a period of time sufficient to remove a substantial portion of air from the adhesive in the adhesive source; and
    interrupting communication between the vacuum source and the adhesive and the adhesive source prior to establishing communication between the adhesive and the connecting space.

3. The method of claim 1 wherein the adhesive is defined further as being curable when exposed to ultraviolet light, and wherein the step of curing the adhesive is defined further to include the step of:
    exposing the adhesive in the connecting space to ultraviolet light for a period of time sufficient to cure the adhesive.

4. The method of claim 1 wherein the step of closing the lid and enclosing the glass member and the frame member in the frame space as defined further as establishing the frame space as being substantially airtight.

5. The method of claim 1, wherein the frame member is defined further as being constructed of a metal.

6. The method of claim 1 wherein the edge of the glass member has an irregular configuration and the edge of the frame member has a mating irregular configuration.

* * * * *